United States Patent
Groh

(10) Patent No.: US 9,258,031 B2
(45) Date of Patent: Feb. 9, 2016

(54) DYNAMIC RANGE COMPRESSOR

(71) Applicant: INSTITUT FUR RUNDFUNKTECHNIK GMBH, Munich (DE)

(72) Inventor: Jens Groh, Munich (DE)

(73) Assignee: Institut fur Rundfunktechnik GMBH, Munich (DE)

( * ) Notice: Subject to any disclaimer, the term of this patent is extended or adjusted under 35 U.S.C. 154(b) by 0 days.

(21) Appl. No.: 14/409,939

(22) PCT Filed: Jun. 18, 2013

(86) PCT No.: PCT/EP2013/062641
§ 371 (c)(1),
(2) Date: Dec. 19, 2014

(87) PCT Pub. No.: WO2013/189938
PCT Pub. Date: Dec. 27, 2013

(65) Prior Publication Data
US 2015/0188602 A1   Jul. 2, 2015

(30) Foreign Application Priority Data
Jun. 19, 2012  (IT) .............................. TO2012A0530

(51) Int. Cl.
*H04B 1/16*    (2006.01)
*H04B 1/66*    (2006.01)
(Continued)

(52) U.S. Cl.
CPC ................ *H04B 1/66* (2013.01); *H03G 7/002* (2013.01); *H03G 7/007* (2013.01); *H03G 9/025* (2013.01);
(Continued)

(58) Field of Classification Search
CPC ........ H04B 1/16; H04B 1/163; H04B 1/1661; H04B 1/1692; H04B 1/64; H04B 1/66; H04B 1/662; H04B 1/667

USPC ................................... 375/240; 381/104, 106
See application file for complete search history.

(56) References Cited

U.S. PATENT DOCUMENTS 4,701,953 A * 10/1987 White ........................... 704/226
7,590,250 B2 * 9/2009 Ellis et al. .................... 381/94.3
(Continued)

FOREIGN PATENT DOCUMENTS

| WO | 2004/008801 A1 | 1/2004 |
| WO | 2007/120453 A1 | 10/2007 |
| WO | 2013/189938 A1 | 12/2013 |

OTHER PUBLICATIONS

International Search Report dated Aug. 19, 2013, issued in PCT Application No. PCT/EP2013/062641, filed Jun. 18, 2013.
(Continued)

*Primary Examiner* — Siu Lee
(74) *Attorney, Agent, or Firm* — Workman Nydegger

(57) ABSTRACT

A dynamic range compressor of a subband type for carrying out a dynamic compression on a broadband input signal includes a subband splitting device for splitting the broadband input signal into K narrowband subband signals. An amplifier unit amplifies each of the K subband signals to obtain K amplified subband signals. Further, a subband combining device is provided for combining the K amplified subband signals to obtain a broadband output signal, which is a dynamically compressed version of the broadband input signal. An envelope detecting device generates, for each of the K subbands, a respective one of K envelope signals. An amplifier control device generates, in dependence of the K envelope signals, K amplifier control signals, each being representative of one of the K amplification factors. The amplifier control device is adapted to generate an amplification control signal in dependence of more than one of the K envelope signals.

16 Claims, 7 Drawing Sheets

(51) Int. Cl.
*H03G 7/00* (2006.01)
*H03H 17/02* (2006.01)
*H04B 1/00* (2006.01)
*H04B 1/18* (2006.01)
*H03G 9/02* (2006.01)

(52) U.S. Cl.
CPC ........... *H03H 17/0267* (2013.01); *H04B 1/001* (2013.01); *H04B 1/0017* (2013.01); *H04B 1/1638* (2013.01); *H04B 1/18* (2013.01)

(56) References Cited

U.S. PATENT DOCUMENTS 8,879,750 B2 * 11/2014 Walsh .................... H03G 9/005 381/103
2009/0175466 A1 * 7/2009 Elko et al. .................... 381/94.2
2011/0116551 A1 * 5/2011 Vezyrtzis et al. ........ 375/240.25
2011/0188671 A1 * 8/2011 Anderson et al. ............ 381/94.3

OTHER PUBLICATIONS

Written Opinion dated Aug. 19, 2013, issued in PCT Application No. PCT/EP2013/062641, filed Jun. 18, 2013.

International Preliminary Report on Patentability dated Oct. 22, 2014, issued in PCT Application No. PCT/EP2013/062641, filed Jun. 18, 2013.

* cited by examiner

DYNAMIC RANGE COMPRESSOR

The invention relates to a dynamic range compressor according to the preamble of claim 1.

A dynamic range compressor of this kind is known from the U.S. Pat. No. 6,097,824

With known dynamic range compressors generation of a compressed signal is generally effected by means of controlled amplification of an input signal. Control of the amplification is generally effected by multiplication with a control signal, which is derived by a characteristic line generator from an envelope signal. Here the case is considered in that the envelope signal is derived from the input signal and therefore represents the envelope curve of the input signal. If amplification is controlled at too fast a rate, this can produce audible distortion. Therefore, the envelope signal, and thus also the control signal, is generally smoothed in such a way that it is of a substantially lower frequency than the input signal, thereby preventing disturbingly audible distortions. However, a disadvantage of this slowed-down amplification control is that the changes in amplification over time may become disturbingly audible, which is also referred to as the "pumping" effect.

A known means for reducing the "pumping" effect is to split the input signals into frequency bands for generating subband signals and to have separate amplification control for the subband signals. This process is called multiband compression, as opposed to broadband compression, in which there is no splitting. Envelope signals and control signals for the frequency bands are each derived separately in this process. Nonetheless, the output signal of such a dynamic range compressor contains disturbing components which apparently cannot be removed by this splitting into subbands.

The object of the invention is to remove these disturbing components or at least substantially suppress them. For this purpose, the dynamic range compressor according to the preamble of claim 1 is characterised according to the characterising part of claim 1. In a preferred embodiment of the invention the dynamic range compressor is characterised according to claim 2 or 3. Further preferred exemplary embodiments of the dynamic range compressor according to the invention are defined in the other subclaims.

The invention is based on the following knowledge.

A multiband compression has the effect that a substantially variable envelope curve (transient case) in one of the frequency bands does not also influence the amplification control in other frequency bands. In this way the "pumping" effect is limited to the respective own frequency band of a subband signal and is altogether reduced. However, one disadvantage of this may be that in the case of non-variable or negligibly variable envelope curves (stationary case), the multiband compression causes a disturbingly audible corruption of relations between frequency portions of the total signal.

A known means for splitting the input signal into frequency bands is a filter bank. By means thereof, the subband signals are derived from the input signal. These filter banks are typically characterised in that the subband signals, leaving aside a possible overall delay, add up to result in the input signal (conservation of the signal sum). Envelope bands for the frequency bands are typically derived using power measurements because power is an appropriate equivalent for volume. Power can be measured for a subband by squaring the subband signal and subsequently smoothing it, as required. But there may be the disadvantage that generally the condition that the integrated sum of these powers is equal to the integrated power of the input signal (conservation of the energy sum) is not fulfilled.

That is why for broadband signals the power total is not necessarily an equivalent for the volume total so that a multiband compression of such signals based on subband powers may not necessarily be effected with full accuracy with regard to the volume.

The inventive idea consists in creating a continuous transition between a multiband compression and a broadband compression. To this end the envelope signals of the frequency bands are coupled with each other in a multiband compression for deriving the amplifier control signals, which can assume the following separate values for each frequency band, the relative change over time of which remains the same as the relative change over time of the associated envelope signal prior to the coordination so that the compression acts as a pure multiband compression (multiband compression type), an identical common value so that the compression, despite the multiband structure, shows the same as that of a broadband compression (broadband compression type), and also intermediate values between the two above-mentioned cases so that the compression exhibits a transient behaviour between the said compression types.

The coupling of the envelope signals is effected in such a way that the common value of the broadband compression type is equal to the sum of the stationary envelope signals.

This means that the sum of the stationary envelope signals is equivalent to the total volume of the input signal provided that the envelope signals are equivalent to volume portions of the input signal.

In addition, the coupling of the envelope signals is effected in such a way that a momentary change in an individual envelope signal of a frequency band causes a momentary change in the amplification control signal proportional to this change, but does not cause a momentary change in the amplification control signals of the remaining frequency bands. This means that the momentary change of an envelope signal is equivalent to the momentary change of the associated volume portion of the input signal provided that the envelope signals are equivalent to volume portions of the input signal.

In addition, the coupling of the envelope signals is effected in such a way that there is a continuous relaxation over time from a multiband compression to a broadband compression. This means that, for example, for a single sudden change of an envelope curve that, at the moment of the change, i.e., in a transient case, the compression is of the multiband type, the compression subsequently passes through a continuous transition, which then ends in the stationary case in a constant envelope curve, wherein the compression is of the broadband type. Advantageously the relaxation of the compression type has the effect that both the "pumping" effect is limited to its respective own frequency band of a subband signal and also that corruption of relations between subband signals with stationary envelope curves is prevented.

The said characteristics of envelope coupling, taken together, cause an additional typically undesirable modulation of the signal volume of the compressed signal to be small, for a compression which uses amplification control signals derived from the coupled envelope signals. This modulation is smallest if the envelope signals are exactly equivalent to volume portions of the input signal. Even if equivalence applies only in an approximation said coupling of the envelope signals still has said advantageous effect that distortions and "pumping" effect can be reduced, wherein the extent of this effect may, however, be less so.

Further details are revealed in the following further ideas.

As already mentioned, it is advantageous if the envelope signals are equivalent to volume portions of the input signal. This is achieved in that the envelope signals are formed from subband power signals, the integrated sum of which is the subband power signals equal to the integrated power of the input signals (conservation of the energy sum). Thereby, the subband power signals split the power of the input signal essentially into the same frequency bands, as into which the input signal is split into subband signals. The subband signals are derived from the input signal by means of a filter bank, which has the characteristic of conservation of the signal sum and, in addition, is expanded by a number of outputs for subband-supplementing signals which are also derived from the input signal. There is one subband-supplementing signal for each frequency band split. Each subband power signal is derived from a combination of the squared subband signal of the respective frequency band and a squared subband-supplementing signal associated with the frequency band. This has the effect that the integrated squared subband signals and the integrated squared subband-supplementing signals, apart from a possible delay, add up again to give the integrated squared input signal (conservation of the energy sum).

In addition, a portion of the squared subband-supplementing signals is optionally redistributed before being combined with the squared subband signals. This modified way of deriving the subband-supplementing signals leads to smoother envelope signals and thereby advantageously to a reduction of distortions. Besides, due to this kind of derivation, an optimisation of matching the frequency band limits of the signal split to the frequency band limits of the power split.

A further reduction in distortion is advantageously achieved by optionally adding additional individual smoothing of the envelope signals by means of smoothing filters.

A further advantage optionally results from a dependency of the set bandwidth of the smoothing filters in such a way that the bandwidth of the smoothing filters increases as the bandwidth of the respective frequency band increases. This leads to an improvement of the compromise between possible impairments due to excessively fast and excessively slow control of the amplification.

By optionally adding frequency-band-depending weighting of the subband power signals using weighting factors optimised with regard to hearing perception, higher accuracy is advantageously achieved as regards equivalence to volume.

SHORT DESCRIPTION OF THE FIGURES

In the following description of the figures the invention is explained in further detail, in which FIG. 1 shows a first exemplary embodiment of the dynamic range compressor according to the invention, FIG. 2 shows an embodiment of the amplification control device of the dynamic range compressor of FIG. 1, FIG. 3 shows the compression characteristic of the dynamic range compressor, FIG. 4 shows a possible embodiment of the subband splitting device in the dynamic range compressor of FIG. 1, FIG. 5 shows various signals in the subband splitting device of FIG. 1, FIG. 6 shows an exemplary embodiment of the envelope detector in the dynamic range compressor of FIG. 1, and FIG. 7 shows a second exemplary embodiment of the dynamic range compressor according to the invention.

Figure 1:
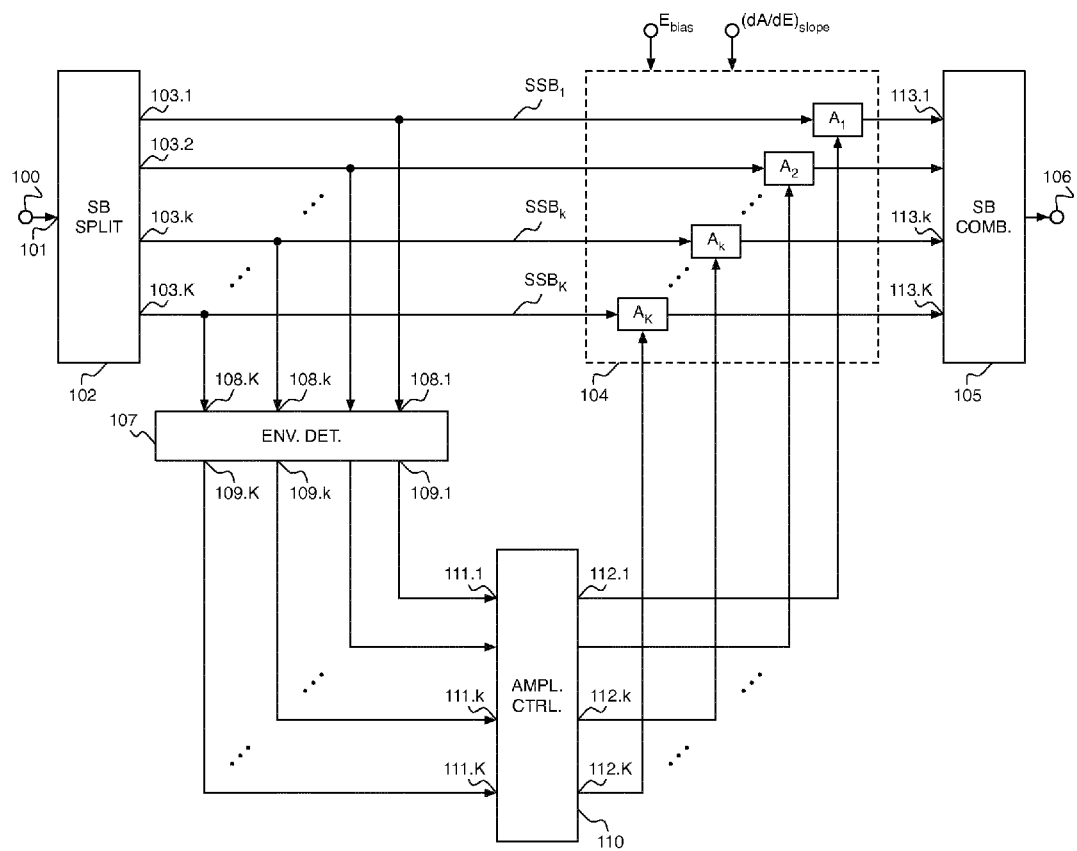
FIG. 1 shows a first exemplary embodiment of the dynamic range compressor according to the invention. The dynamic range compressor is of the subband type and is provided with an input 100 for receiving a broadband input signal, in particular, a broadband audio signal. The input 100 is coupled to an input 101 of a subband splitting device 102 for splitting the broadband input signal into K subband signals $SSB_k$ in associated frequency subbands $SB_k$, which are supplied at outputs 103.1, 103.2, ... 103.k, ... 103.K. K is an integer larger than 1. Preferably K≤32 is valid. The broadband input signal generally is an audio signal, possibly already digitised, having a bandwidth in the order of magnitude of typically 15 kHz to 30 kHz. The narrowband subband signals are preferably bandpass signals of equal relative bandwidth and a supplementary lowpass signal. A typical value for K is 10, wherein the bandpass signals respectively cover a frequency range at a ratio of 1 and 2 (octave filter bank) and the lowpass signal follows at the lowest of these frequency ranges. 'Narrow' in 'narrowband' is therefore to be understood as: narrower than the bandwidth of the (broadband) input signal.

An amplifier unit 104 is provided for amplifying each of the K subband signals with an associated amplification factor for generating K amplified subband signals. The K amplified subband signals are supplied to a subband combining device 105. The subband combination device is adapted to combine the K amplified subband signals for generating an output signal that is a version of the broadband input signal compressed in respect of the dynamics and that is supplied at an output 106 of the dynamic range compressor. An envelope detecting device 107 is provided for generating K envelope signals, each of the envelope signals for one of the respective frequency subbands $SB_k$. Inputs 108.1, ..., 108.k, ... 108.K of the envelope detecting device 107 are coupled with respective outputs 103.1, ... 103.k, 103.K of the subband splitting device 102. The respective envelope signals are supplied at respective outputs 109.1, ..., 109.k, ... 109.K of the envelope detecting device 107. The outputs of the envelope detecting device 107 are coupled with respective inputs 111.1, ..., 111.k, ... 111.K of an amplifier control device 110. The amplifier control device 110 is adapted for generating K amplifier control signals in dependence of the K envelope signals that are supplied at their inputs 111.1 to 111.K, wherein each of the K amplifier signals is representative for one of the K amplification factors. The generated K amplifier control signals are supplied at outputs 112.1 to 111.K. In particular the amplifier control device 110 generates an amplifier control signal in dependence of more than one of the K envelope signals. The outputs 112.1 to 112.K of the amplifier control device 110 are coupled with control outputs of respective amplifiers $A_1$ to $A_K$ in the amplifier unit 104 and the amplifier control signals realise an amplification in the amplifiers according to the respective amplification factors. Furthermore inputs of amplifiers $A_1$ to $A_K$ are coupled with outputs 103.1 to 103.K of the subband splitting device 102. Outputs of the amplifiers $A_1$ to $A_K$ are coupled with the respective inputs 113.1 to 113.K of the subband combining device 105.

According to the invention amplifier control signals are derived in the amplifier control device 110 in dependence of more than one of the K envelope signals. Preferably, an amplifier control signal is derived in dependence of all of the K envelope signals.

In particular, the amplifier control device is adapted for generating all amplifier control signals in dependence of all of K envelope signals.

The amplifier control device is further adapted to generate different amplification factors for different subbands in case the broadband input signal shows a transient behaviour and is adapted to generate approximately equal amplification factors for different subbands in the case that the broadband input signal shows an approximately stationary behaviour. This will be explained in more detail further below.

Figure 2:
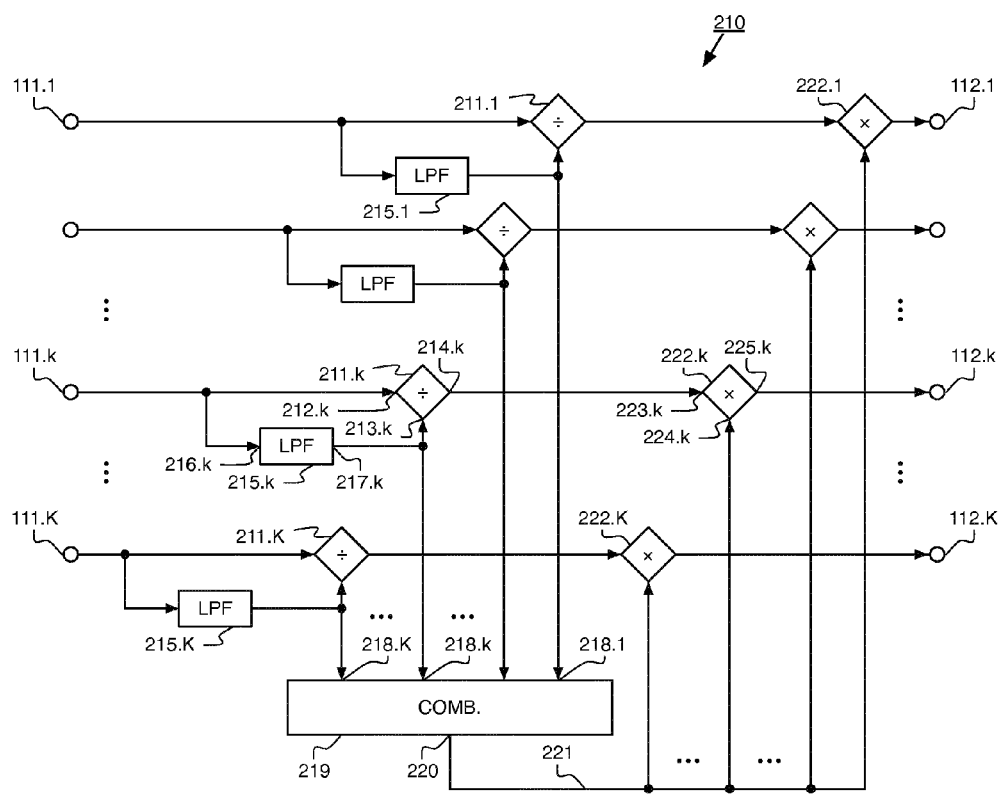

FIG. 2 shows an embodiment of the amplifier control device 110 of the dynamic range compressor of FIG. 1. The amplifier control device, here indicated with reference symbol 210, includes K divider units 211.1 to 211.K, each having a first input 212.k coupled with an associated input 111.k of the K inputs 111.1 to 111.K of the amplifier control device 210, and with a second input 213.k and an output 214.k.

K lowpass filter units 215.1 to 215.K are provided, respectively having an input 216.k coupled with an associated input 111.k of the K inputs of the amplifier control device 210, and with an output 217.k, coupled with an associated second input 213.k of one of the K associated divider units 211.1 to 211.K. The outputs 217.k of the K lowpass filter units 215.1 to 215.K are coupled with associated inputs 218.1 to 218.K of a signal combination unit 219. The signal combination unit 219 is provided with an output 220. The signal combination unit 219 is adapted to generate a combination signal 221 in dependence of the signal received at its K inputs 218.1 to 218.K.

K multiplication units 222.1 to 222.K are provided, each having a first input 223.k coupled with an associated output 214.k of one of the K divider units 211.k, having a second input 224.k, coupled with the output 220 of the signal combination unit 219, and having an output 225.k. At the outputs 225.1, ... 225.k, ... 225.K output signals are present, which are representative of die amplification factors supplied to the amplifiers $A_1$ to $A_K$. For this purpose, the outputs 225.k of the multiplication units 222.k are coupled with the associated outputs 112.k of the amplifier control device 210.

Preferably, the lowpass filter units 215.1 to 215.K are adapted to execute lowpass filtering applied to the signals at their inputs, wherein the filtering leads to a non-negative impulse response, such as first-order lowpass filtering. The signal combination unit 219 preferably is an adding circuit, which adds the signals at its inputs in order to obtain the output signal at the output 220. A dividing circuit, such as dividing circuit 211.k, operates in such a way that it divides the input signal at the input 111.k by the lowpass-filtered input signal at the output of the lowpass filter 216.k.

This design has the effect that the output signal of the dividing circuit forms a ratio between the quick changes and the slow changes of the associated envelope curve. This ratio, in the case where the subband signal is stationary, is approximately equal to 1, whilst it vice versa signals the transient envelope change (transience ratio) in the transient case. For example, if there is a sudden rise, the ratio will be a value higher than 1, thereby indicating the extent of the rise. If all subbands are stationary, the amplifier control signals of all subbands will be approximately equal, i.e., equal to the output signal of the signal combination unit. As soon as a transient deviation from this stationary overall state occurs in a subband, the transience ratio is applied to the associated amplifier control signal due to the effect of the associated multiplying circuit. This has the effect of achieving a slow amplification control for the stationary overall state of all subbands and, at the same time, a fast amplification control for the transient deviations of individual subbands. The lowpass filters ensure that there is a relaxation transition between transient and stationary behaviours. Further, all gradual and combined forms of the just-described types of the envelope behaviour analogously result in corresponding gradual and combined forms of amplifier control signals.

A multiplying circuit, such as multiplying circuit 222.k, multiplies the signals at their inputs with each other for deriving the output signal of the multiplying circuit and thus of the amplifier control signal for controlling the amplification in amplifier $A_k$.

It should be mentioned at this point that the circuit configuration of the amplifier control device 210 of FIG. 2 can be modified in various ways without changing the effect of the circuit. As such the divider units 211.1 to 211.K may be arranged in a different position of the circuit, namely (1) behind the K multiplying units 222.1 to 222.K, i.e., in the connection between the outputs of the K multiplying units 222.1 to 222.K and the associated outputs 112.1 to 112.K, or (2) in the connection from output 220 of the signal combination unit 219 to the respective second inputs of the K multiplying units 222.1 to 222.K.

Figure 3:
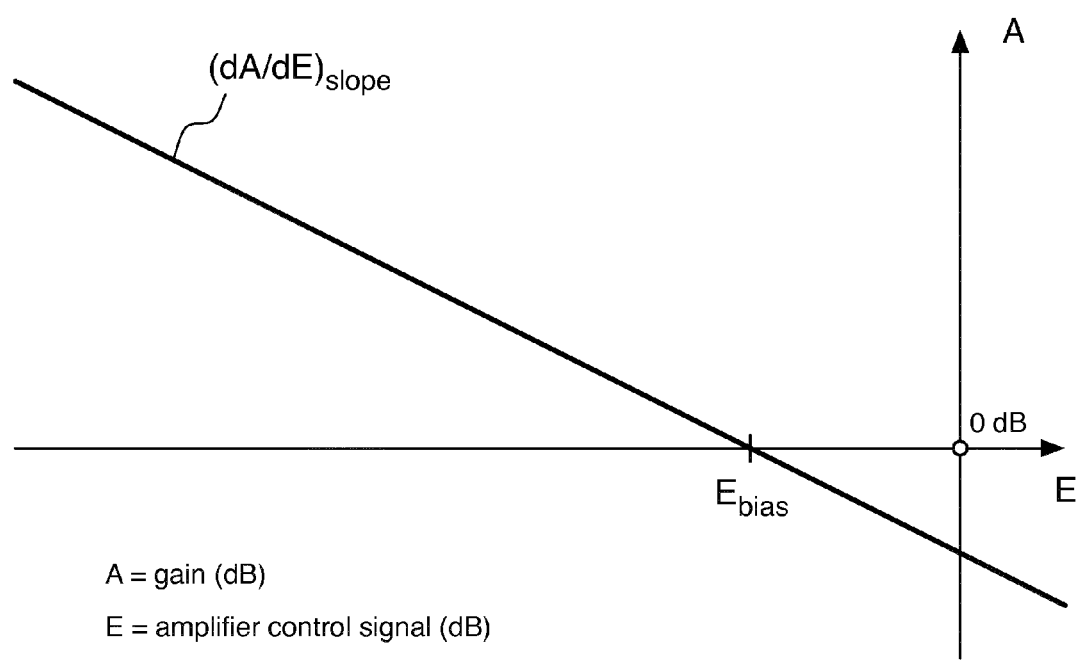

FIG. 3 shows an example of a compression characteristic of the dynamic range compressor. In FIG. 3 the amplification A (in dB) is indicated as a function of the envelope E (in dB).

The falling characteristic control curve of the amplifier device, in this case a straight line, effects that the more the amplification A decreases, the stronger the amplifier control signal, referred to as E, becomes. For a certain value of the amplifier control signal, namely at working point $E_{bias}$, amplification is 0 dB, which means that signals in this case are not amplified. The working point is suitable for fixing a volume target value. Signals that are louder than the target value are attenuated and signals that are quieter than the target value are amplified, which has the effect that the dynamics is compressed. The gradient of the characteristic curve $(dA/dE)_{slope}$ determines the degree of compression; for a gradient value of −1 dB/dB, the dynamic compression effect is at its maximum. Typically, $-1\ dB/dB <= (dA/dE)_{slope} < 0\ dB/dB$, and $-40\ dB <= E_{bias} <= -6\ dB$ with regard to the "Full-Scale"-output drive level is valid. $E_{bias}$ and $(dA/dE)_{slope}$ can be provided as control inputs in order to make them accessible to the user for setting them.

Figure 4:
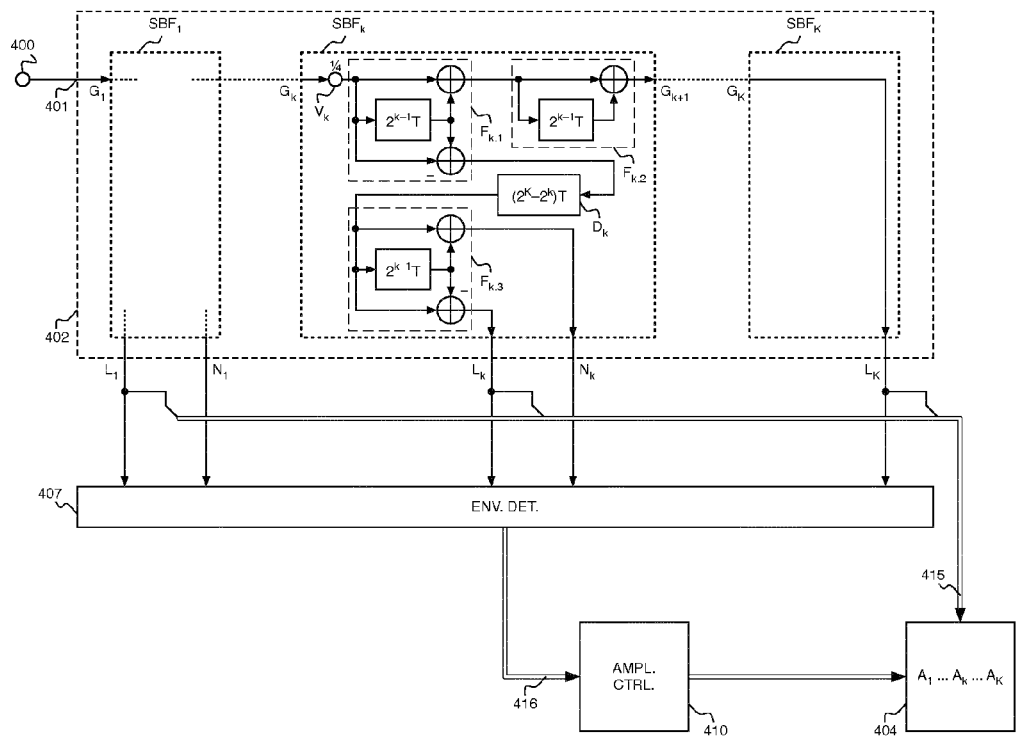

FIG. 4 shows a possible embodiment of the subband splitting device 102 in the dynamic range compressor according to FIG. 1, which is indicated in FIG. 4 by reference symbol 402. As known from the state of the art, the subband splitting device 102 can in general be constructed from a parallel connection of K narrowband subband filters with bandpass character, which preferably are perfectly reconstructeing. In FIG. 4, however, the subband filters $SBF_1$ to $SBF_K$ are constructed in a different way. In this case the K subband filters $SBF_1$ to $SBF_K$ are connected in series, wherein a first output of a subband filter $SBF_k$ is coupled with the input of a following subband filter $SBF_{k+1}$, the input of the first subband filter $SBF_1$ is coupled with the input 401 of the subband splitting device 402. For the k-th subband filter $SBF_k$ the exact construction is shown in detail in FIG. 4. The subband filter $SBF_k$ is equipped with filter circuits $F_{k.1}$, $F_{k.2}$, and $F_{k.3}$, a delay unit $D_k$ and an attenuator unit $V_k$. All the filter circuits $F_{k.1}$, $F_{k.2}$, and $F_{k.3}$ include a delay unit that realises a signal delay of $2^{k-1}$ T, wherein T is the sampling time of the sampling values of the signals. The filter circuits $F_{k.1}$ and $F_{k.3}$ also include an adding circuit and a subtracting circuit. The filter circuit $F_{k.2}$ also includes an adding circuit. The delay circuit $D_k$ realises a signal delay of $(2^K - 2^k) \cdot T$.

The filter circuit $F_{k.3}$ generates two output signals, indicated as $L_k$ and $N_k$, which serve as output signals of the subband filter $SBF_k$, wherein the signal $L_k$ is to be regarded as the main output signal and $N_k$ as a kind of auxiliary signal, the function of which will be explained later. All other subband filters also generate two output signals. Only the subband filter $SBF_K$ generates one output signal $L_K$ only.

Figure 5:
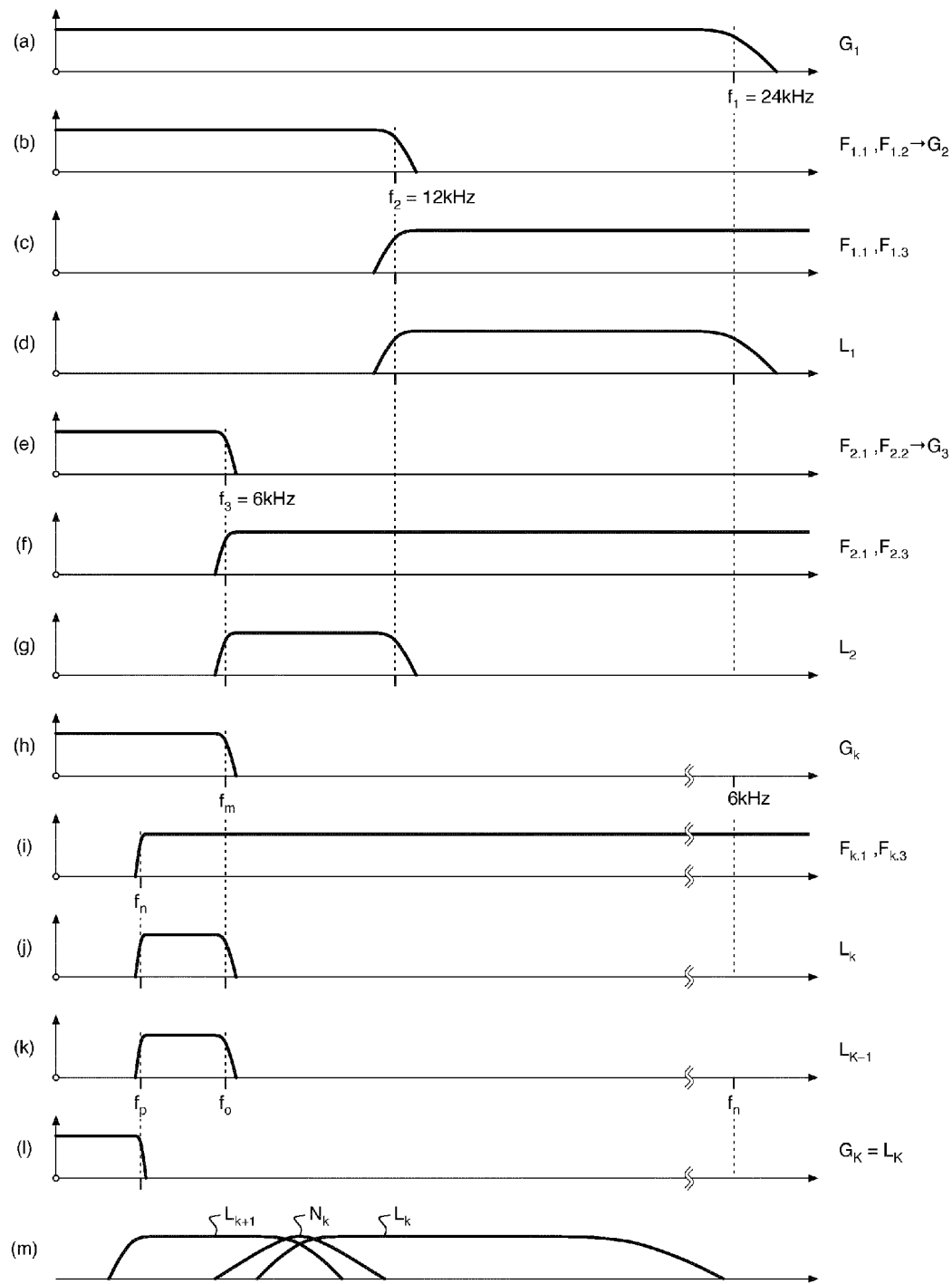

The filter circuits $F_{k.1}$ and $F_{k.2}$ realise lowpass filtering applied to the input signal $G_k$ of a subband filter $SBF_k$ for obtaining the output signal $G_{k+1}$. The filter circuits $F_{k.1}$ and $F_{k.3}$ realise highpass filtering applied to the input signal $G_k$ of a subband filter $SBF_k$ for maintaining the output signal $L_k$. The filter circuits $F_{k.1}$ and $F_{k.2}$ further realise a bandpass filtering applied to the input signal $G_k$ of a subband filter $SBF_k$ for obtaining the auxiliary signal $N_k$. This will be further explained with reference to FIG. 5.

FIG. 5a shows the input signal at input 401 in a schematic manner and shows the bandwidth $f_1$ of the broadband input signal, which is supplied as signal $G_1$ to the first subband filter circuit $SBF_1$. As an example, the assumed bandwidth here is 24 kHz. The lowpass filter characteristic of the series connection of filter circuits $F_{1.1}$ and $F_{1.2}$ is indicated in FIG. 5b and shows a bandwidth $f_2$ which is smaller than the bandwidth of the input signal, in this example equal to 12 kHz. The bandwidth of the output signal $G_2$ of filter circuits $F_{1.1}$ and $F_{1.2}$ and thus of subband filter $SBF_1$ is thus smaller than the bandwidth of the input signal $G_1$. The highpass filter characteristic of the series connection of the filter circuits $F_{1.1}$ and $F_{1.3}$ is shown in FIG. 5c and shows a lower cut-off frequency that is smaller than $f_1$. In this example this lower cut-off frequency is equal to the cut-off frequency $f_2$, i.e. equal to 12 kHz. The bandwidth of filter circuits $F_{1.1}$ and $F_{1.3}$, together with the input signal $G_1$, limited to $f_1$ with regard to its bandwidth thus results in a bandpass-filtered output signal $L_1$ between 12 kHz and 24 kHz, as indicated in FIG. 5d.

FIG. 5b shows the bandwidth of the input signal, which is supplied as signal $G_2$ to the second subband filter circuit $SBF_2$. The lowpass filter characteristic of the series connection of the filter circuits $F_{2.1}$ and $F_{2.2}$ in the subband filter circuit $SBF_2$ is indicated in FIG. 5e and shows a bandwidth $f_3$ that is smaller than the bandwidth of the input signal $G_2$. In this example, the bandwidth is equal to 6 kHz. The bandwidth of the output signal $G_3$ of filter circuits $F_{2.1}$ and $F_{2.2}$ and thus of subband filter $SBF_2$ is thus smaller than the bandwidth of the input signal $G_2$. The highpass filter characteristics of the series connection of filter circuits $F_{2.1}$ and $F_{2.3}$ is indicated in FIG. 5f and shows a lower cut-off frequency smaller than $f_2$. In this example, the lower cut-off frequency is equal to the cut-off frequency $f_3$, i.e. equal to 6 kHz. The bandwidth of filter circuits $F_{2.1}$ and $F_{2.3}$, taken together with input signal $G_2$ limited with regard to its bandwidth to $f_2$, thus results in a bandpass-filtered output signal $L_2$ in between 6 kHz and 12 kHz, as indicated in FIG. 5g.

FIGS. 5h to 5j have frequency axes, which are extended in comparison with the frequency axes in FIGS. 5a to 5g. FIG. 5h shows the bandwidth $f_m$ of the input signal, which is supplied as signal $G_k$ to the k-th subband filter circuit $SBF_k$. The highpass filter characteristic of the series connection of filter circuits $F_{k.1}$ and $F_{k.3}$ in the subband filter circuit $SBF_k$ is indicated in FIG. 5i and shows a lower cut-off frequency smaller than $f_m$. In this example, the lower cut-off frequency, indicated as $f_n$, is equal to half of the frequency $f_m$. The bandwidth of filter circuits $F_{k.1}$ and $F_{k.3}$, taken together with input signal $G_k$ limited in its bandwidth to $f_m$, thus results in a bandpass-filtered output signal $L_k$ between $f_n$ and $f_m$, as indicated in FIG. 5j.

FIGS. 5k and 5l have frequency axes which are extended in comparison with the frequency axes in FIGS. 5h to 5j. FIG. 5k shows the bandwidth of the output signal $L_{K-1}$, which is provided at the second output of the subband filter circuit $SBF_{K-1}$. In the same way, the subband filter circuit $SBF_{K-1}$ at its first output generates the output signal $G_K$ and thus the subband signal $L_K$.

For K=10, the cut-off frequencies in this example therefore lie at $(f_p=)46.875$ Hz, $(f_o=)93.7$ Hz, 187.5 Hz, 375 Hz, 750 Hz, 1.5 kHz, 3 kHz, $(f_3=)6$ kHz, $(f_2=)12$ kHz and $(f_1=)24$ kHz.

In FIG. 5m finally the output signals $L_k$, $N_k$ and $L_{k+1}$ of the subband filter circuit $SBF_k$ are indicated as bandpass-filtered signals. It can be clearly seen that the auxiliary signal $N_k$ is a narrowband auxiliary signal in the frequency range between the narrowband subband signals $L_k$ and $L_{k+1}$.

The reason for the presence of the K−1 auxiliary signals $N_k$ is that, although the subband signals $L_k$ add up to the broadband original signal (apart from a delay which is irrelevant for this discussion), the powers $L_k^2$ of these subband signals $L_k$ when integrated do not in general add up to the integrated power of the broadband original signal. If only subband signals $L_k$ were used for deriving subband envelopes, the volume of the original signal could not be accurately represented by the total of such subband envelopes, but would contain errors depending on the signals. In order to compensate for these errors, additional auxiliary signals $N_k$ are used. Because of the fact that the auxiliary signals $N_k$ complement the filter bank to result in an orthogonal system, they supply the missing power which should be added as a supplement in the form of the scaled auxiliary signal power $a \cdot N_k^2$, wherein a suitable scaling factor is the value a=2. The associated scaled auxiliary signal power is added to each subband signal power thereby achieving error compensation.

The output signals $L_k$ and $N_k$ (for k=1, 2, ... K−1) and $L_K$ are fed to the envelope detecting unit 407, see FIG. 4. The output signals $L_k$ (for k=1, 2, ... K) are fed to the amplifier unit (which matches the amplifier unit 104 in FIG. 1). FIG. 4 also schematically shows the amplification control circuit 110 of FIG. 1, but marked with reference symbol 410 in FIG. 4. The various connecting lines between the different blocks are also shown.

Figure 6:
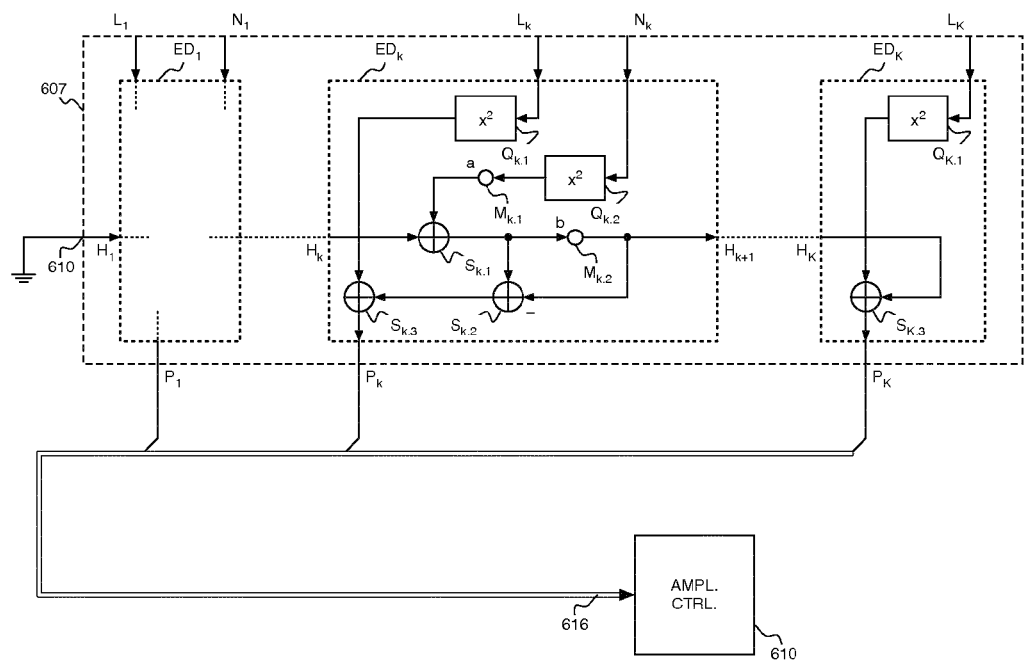

FIG. 6 shows a possible embodiment of the envelope detecting device 107 in the dynamic range compressor according to FIG. 1, wherein the envelope detecting unit in FIG. 6 is indicated by reference symbol 607.

As already mentioned above, this envelope detecting unit 607 works in conjunction with the subband splitting device 402 in FIG. 4. The envelope detecting unit 607 thus receives the signals $L_k$ and $N_k$ (for k=1, 2, ... K−1) and $L_K$ from the subband splitting device 402 in FIG. 4.

The envelope detecting unit 607 has an input 610 for receiving an auxiliary input signal $H_1$. The input 610 is coupled to earth. The signal $H_1$ is supplied as an auxiliary signal to an envelope detector $ED_1$.

The envelope detecting unit 607, for each subband $SB_k$, includes an envelope detector $ED_k$, wherein k=1, 2, ... K. The detectors $ED_k$, for k=1, 2, ... K−1 receive the associated input signals $L_k$ and $N_k$, which were squared in the detector $ED_k$ by means of a squarer $Q_{k.1}$ and $Q_{k.2}$. The squared signal $L_k^2$ is fed to an adder $S_{k.3}$. The squared signal $N_k^2$ after multiplication with a value a, preferably equal 2, is fed to an adder $S_{k.3}$ and in there is added to an auxiliary signal $H_k$. The output signal of the adder $S_{k.1}$ after multiplication in a multiplier $M_{k.2}$, is fed as an auxiliary signal $H_{k+1}$ to the nearest envelope detector $ED_{k+1}$. The circuit of the multiplier $M_{k.2}$ and a subtractor $S_{k.2}$ realises a multiplication applied to the output signal of the adder $S_{k.1}$ with a value of (1−b) and results in a signal which is supplied to the second input of adder $S_{k.3}$.

The output signal of the adder $S_{k.3}$ is the envelope signal $P_k$.

For the value b, $0 \leq b \leq 1$ is preferably valid. If b=0, the envelope detecting unit 607 then simplifies to result in uncoupled envelope detectors (therefore no auxiliary signals $H_k$) and a direct coupling between the output of the multiplier $M_{k.1}$ and the second input of the adder $S_{k.3}$ so that the adders $S_{k.1}$ and $S_{k.2}$ can be omitted. If b=0.5, the envelope detecting unit 607 also simplifies, due to the fact that adder $S_{k.2}$ can be omitted.

The detector $ED_K$ receives the associated input signal $L_K$, which is squared in detector $ED_K$ by means of squarer $Q_{K.1}$. The squared signal $L_K^2$ is fed to an adder $S_{K.3}$ and therein is added to form an auxiliary signal $H_K$.

The output signal of the adder $S_{K.3}$ is the envelope signal $P_K$.

The envelope signals $P_k$ (for k=1, 2, ... K) are fed to the amplification control circuit 510 via a line 516, which matches line 416 in FIG. 4.

This derivation of the envelope signals is based on the principle of signal power. The effect of units $Q_{k.1}$, $Q_{k.2}$, $M_{k.1}$, and $S_{k.3}$ can be explained by the observations made with regard to FIG. 5. In this way, a relatively low waviness of the envelope curve with regard to the frequency portions in the subband signal is achieved, a fact that speaks in favour of using the envelope curve for obtaining a low-distortion amplification control. Because the frequency focus of the subband envelope has moved somewhat relative to the frequency focus of the associated subband signal due to adding the scaled auxiliary signal power, a small portion of the subband power of the respective frequency band is optionally branched off with the aid of the units $S_{k.1}$, $M_{k.2}$, and $S_{k.2}$ with this amount being passed on to the next lower frequency band. The sum of the subband powers remains unchanged. This compensates for the shift in the frequency focus. The portion factor b can be optimised. If b=0.5 in all envelope detecting units, a particularly smooth impulse response of the subband envelopes is obtained.

Due to the fact that the subband splitting device (102) in FIG. 1 is constructed as shown in FIG. 4, the subband combining device 105 can be implemented in a very simple way, namely in that it can operate as a pure signal adder applied to only K amplified subband signals.

Figure 7:
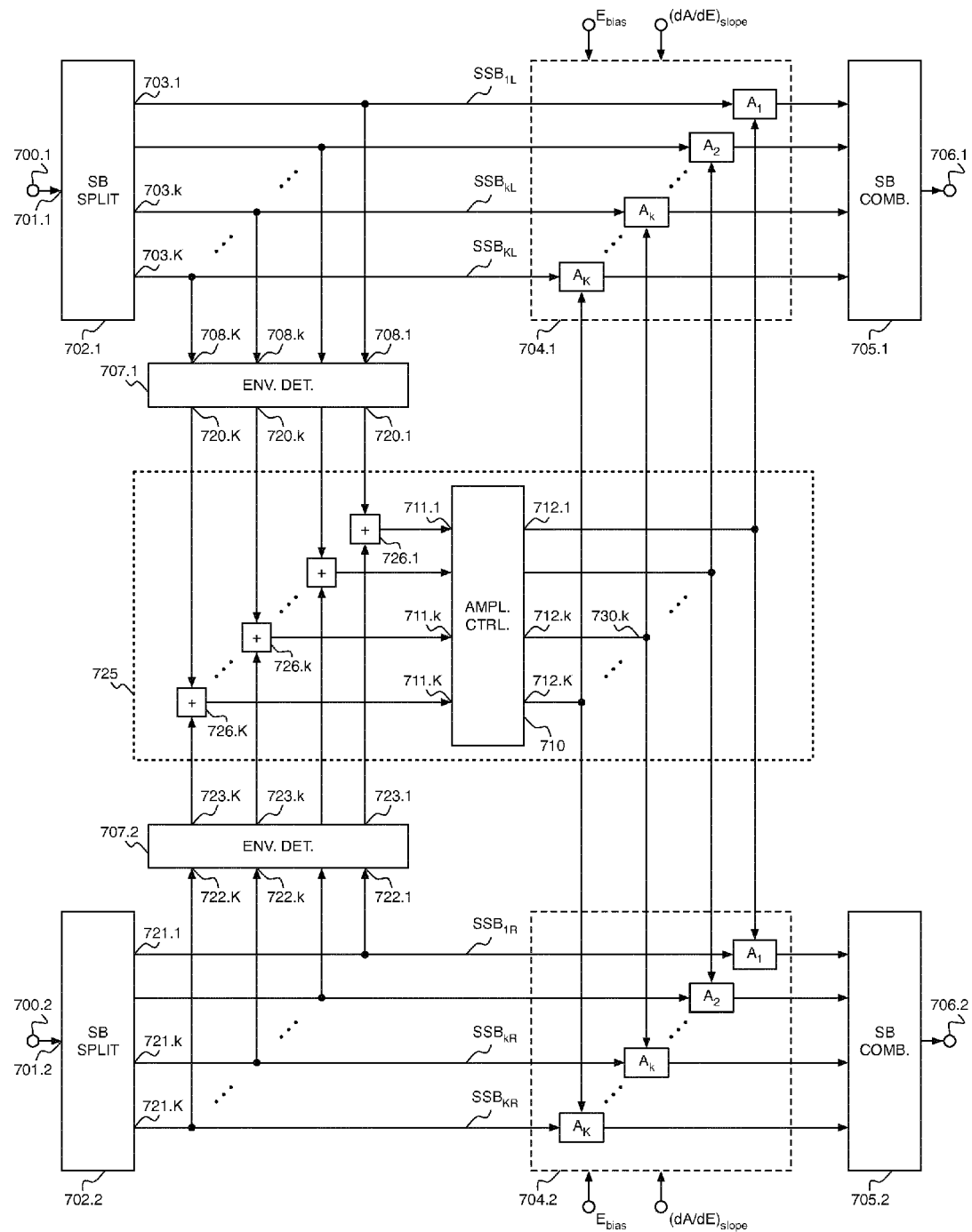

FIG. 7 schematically shows a second exemplary embodiment of the dynamic range compressor according to the invention, in the case that a stereo audio signal is to be controlled in the dynamics. The dynamic range compressor is formed by two branches, one branch for each of two stereo channels. The first branch is formed by an input 700.1 for receiving one of the two stereo audio signals, for example, the left signal. The input 700.1 is coupled with an input 701.1 of a subband splitting device 702.1 for splitting the broadband input signal into the K subband signals, which are supplied on K outputs 703.1 to 703.K. An amplifier unit 704.1 is provided for amplifying each of the K subband signals with an associated amplification factor for generating K amplified subband signals. The K amplified subband signals are supplied to a subband combination device 705.1. The subband combination device 705.1 is adapted to combine the K amplified subband signals for generating an output signal, which is supplied at an output 706.1 of the dynamic range compressor. An envelope detecting unit 707.1 is provided for generating K envelope signals, each of the envelope signals for one of the respective frequency subbands $SB_k$. Inputs 708.1 to 708.K of the envelope detecting unit 707.1 are coupled with respective outputs 703.1 to 703.K of the subband splitting device 702.1. The respective envelope signals at outputs 720.1 to 720.K of the envelope detecting unit 707.1 are supplied to an amplifier control device 725.

The second branch is formed by an input 700.2 for receiving the other of the two stereo channel audio signals, e.g. the right signal. The input 700.2 is coupled with an input 701.2 of a subband splitting device 702.2 for splitting the broadband input signal into the K subband signals, which are supplied at K outputs 721.1 to 721.K. An amplifier unit 704.2 is provided for amplifying each of the K subband signals with an associated amplification factor for generating K amplified subband signals. The K amplified subband signals are supplied to a subband combination device 705.2. The subband combination device 705.2 is adapted to combine the K amplified subband signals for generating an output signal, which is supplied at an output 706.2 of the dynamic range compressor. An envelope detecting unit 707.2 is provided for generating K envelope signals, each of the envelope signals for one of the respective frequency subbands $SB_k$. Inputs 722.1 to 722.K of the envelope detecting unit 707.2 are coupled with respective outputs 721.1 to 721.K of the subband splitting device 702.2. The respective envelope signals at the outputs 723.1 to 723.K of the envelope detecting unit 707.2 are also supplied to the amplifier control device 725.

The amplifier control device 725 is adapted for generating the K amplification factors for the amplifier unit 704.1 and for generating the K amplification factors for the amplifier unit 704.2, in dependence of the K envelope signals from the envelope detector 707.1 and in dependence of the K envelope signals from the envelope detector 707.2.

For this purpose, the outputs 720.1 to 720.K of the envelope unit 707.1 and the outputs 723.1 to 723.K of the envelope unit 707.2 are coupled with associated inputs of the amplifier control device 725.

In one embodiment of the amplifier control device 725, the amplifier control device 725 includes K signal combining units 726.1 to 726.K; in particular, these signal combining units are signal adders. A signal combination unit 726.k is adapted for combining (adding) the envelope signal from the output 720.k of the envelope detector 707.1 with the envelope signal from the output 723.k of the envelope detector 707.2 (this for k equal to 1 to K).

The K output signals of the K signal combining units 726.1 to 726.K are supplied to associated inputs 711.1 to 711.K of a signal block 710. In one embodiment this signal block 710 looks exactly like the amplifier control device 210, as described in FIG. 2.

The outputs 712.1 to 712.K of the signal block 710 represent the K outputs of the amplifier control device 725 and are coupled with the control input of the amplifiers in the amplifier unit 704.1, for feeding K amplifier control signals to these amplifiers and thus for controlling the amplification in these amplifiers. These outputs 712.1 to 712.K are also coupled with the control inputs of the amplifiers in the amplifier unit 704.2, for feeding K amplifier control signals to this amplifier and thus for controlling the amplification in these amplifiers. An amplifier control signal 730.k is supplied both to the amplifier $A_k$ of the amplifier unit 704.1 and to the amplifier $A_k$ of the amplifier unit 704.2 for controlling the amplification in these amplifiers (wherein k equal 1 to K).

According to the invention, the amplifier control device 725 is adapted for generating one of the amplifier control signals in dependence of more than one of the 2K envelope signals. In particular, the amplifier control device 725 is adapted for generating an amplifier control signal in dependence of all of the 2K envelope signals. In particular, the amplifier control device 725 is adapted for generating all 2K amplifier control signals in dependence of all of the 2K envelope signals. This is achieved, in that a signal combining circuit in signal block 710 (this is the signal combining circuit 219 in FIG. 2) adds all signals together that are supplied at their inputs.

The dynamic range compressors according to FIG. 7 operates in such a way that the amplifier control device 710 is adapted for generating different amplification factors for different subbands for the two stereo signals in the case that the broadband stereo signal shows a transient behaviour, and is adapted for generating approximately equal amplification factors for different subband in both stereo signals in the case that the broadband stereo signal shows an approximately stationary behaviour.

Furthermore, the dynamic range compressor operates in such a way that the amplifier control device 710 is adapted to decouple the amplifier control in one subband in one of the two stereo signals from the amplifier control in other subbands of the two stereo signals, in case a transient occurs in this subband.

In particular the dynamic range compressor operates such that the amplifier control device 710 is adapted for coupling the amplifier control in all subbands for generating an equal amplification factor for all subbands for the two stereo signals, after the transient has finished.

The invention claimed is:

1. A dynamic range compressor of a subband type, comprising:
   an input for receiving a broadband input signal for carrying out a dynamic compression thereon,
   a subband splitting device for splitting the broadband input signal into K narrowband subband signals (SSB1, ... SSBk, ... SSBK), where K is an integer larger than 1,
   an amplifier unit for amplifying each of the K subband signals by a respective amplification factor (A1, ... AK) to obtain K amplified subband signals,
   a subband combining device for combining the K amplified subband signals to obtain a broadband output signal, which is a dynamically compressed version of the broadband input signal,
   an envelope detecting device for generating for each of the K subbands a respective one of K envelope signals,
   an amplifier control device for generating, in dependence of the K envelope signals, K amplifier control signals, each of the K amplifier control signals being representative of one of the K amplification factors, characterized in that,
   the amplifier control device is adapted to generate an amplification control signal in dependence of more than one of the K envelope signals,
   wherein the amplifier control device is adapted to generate different amplification factors for different subbands, in a situation where the broadband input signal exhibits a transient behavior, and is adapted to generate substantially the same amplification factors for different subbands, in a situation where the broadband input signal exhibits a substantially stationary behavior.

2. The dynamic range compressor as claimed in claim 1, wherein the amplifier control device is adapted to decouple the amplifier control in a subband from the amplifier control in other subbands, in a situation where a transient occurs in the said subband.

3. The dynamic range compressor as claimed in claim 2, wherein the amplifier control device is adapted to couple the amplifier control in all subbands to obtain a substantially equal amplification factor for all the subbands, after the disappearance of the transient in said subband.

4. The dynamic range compressor as claimed in claim 1, wherein the amplifier control device comprises:
   K inputs (111.1, ..., 111.k, ... 111.K) for receiving the K envelope signals,
   K divider units (211.1, ..., 211.k, ... 211.K), each having an first and a second input (212.k, 213.k) and an output (214.k),
   K lowpass filter units (215.1, ... 215.k, ..., 215.K), each having an input (216.k) coupled to a respective one (211.k) of the K inputs of the amplifier control device, and an output (217.k) coupled to a respective one (213.k) of the second inputs of the K divider units (211.k),
   a signal combination unit having K inputs, each input (218.k) being coupled to a respective one (217.k) of the outputs of the K lowpass filter units (215.k), and an output, the signal combination unit being adapted to generate a combination signal in dependence of the signals received via its inputs,
   K multiplication units (222.1, ..., 222.k, ..., 222.K), each having a first input (223.k) coupled to a respective one of the K inputs of the amplifier control device, a second input (224.k) coupled to the output of the signal combination unit, and an output (225.k),
   K outputs (112.1, 112.K) for supplying the K amplifier control signals representative of the amplification factors, each of the K outputs(112.k) being coupled to a respective one (225.k) of the outputs of the K multiplication units.

5. The dynamic range compressor as claimed in claim 4, wherein a divider unit is either
   arranged in between an input (111.k) of the amplifier control device and a first input (223.k) of a multiplication unit (222.k), or is
   arranged between the output of a multiplication unit (222.k) and an output (112.k) of the amplifier control device, or is
   arranged between the output of the signal combination unit and a second input (224.k) if a multiplication unit (222.k).

6. The dynamic range compressor as claimed in claim 4, wherein the lowpass filter units (215.k) are adapted to carry out a lowpass filtering on the signals applied to its inputs, which lowpass filtering results in a non-negative impulse response.

7. The dynamic range compressor as claimed in claim 4, wherein the signal combination unit is adapted to add the signals applied to its inputs to generate the combination signal.

8. The dynamic range compressor as claimed in claim 4, wherein the subband splitting device comprises K perfectly reconstructing filters for generating the K subband signals.

9. The dynamic range compressor as claimed in claim 4, wherein the subband combination device comprises K perfectly reconstructing filters for generating the dynamically compressed version of the broadband input signal.

10. The dynamic range compressor as claimed in claim 4, wherein an envelope signal is a measure of the envelope of one of the K subband signals.

11. The dynamic range compressor as claimed in claim 4, wherein the dynamic range compressor is further provided with
    a second input for receiving a second broadband input signal, for carrying out a dynamic compression thereon,
    a second subband splitting device for splitting the second broadband input signal into K narrowband subband signals of the second input signal,
    a second amplifier unit for amplifying each of the K subband signals of the second input signal by a respective amplification factor to obtain K amplified subband signals of the second input signal, a second subband combining device for combining the K amplified subband signals of the second input signal to obtain a second broadband output signal, which is a dynamically compressed version of the second broadband input signal, a second envelope detecting device for generating, for each of the K subbands, a respective one of K envelope signals of the second input signal, an amplifier control device for generating in dependence of the K envelope signals of the second input signal K additional amplifier control signals, each of the K additional amplifier control signals being representative of one of the K amplification factors for the second amplifier unit, characterized in that the amplifier control device is adapted to generate an additional amplification control signal in dependence of more than one of the 2K envelope signals, at least one of the envelope signals being an envelope signal from the first broadband input signal and at least a second one of the envelope signals being an envelope signal from the second broadband input signal.

12. The dynamic range compressor as claimed in claim 11, wherein each of the K additional amplification control signals for the second broadband input signal equals one of the K amplifier control signals for the first broadband input signal.

13. The dynamic range compressor as claimed in claim 12, wherein the amplifier control device is further provided with K signal combination units (726.k), each k-th signal combination unit being adapted to combine the k-th envelope signals of the first and second broadband input signals.

14. The dynamic range compressor as claimed in claim 11, wherein the amplifier control device is adapted to generate an amplifier control signal and/or an additional amplifier control signal in dependence of all of the 2K envelop signals.

15. The dynamic range compressor as claimed in claim 11, wherein the amplifier control device is adapted to generate all amplifier control signals and additional amplifier control signals in dependence of all of the 2K envelope signals.

16. A dynamic range compressor of a subband type, comprising an input for receiving a broadband input signal for carrying out a dynamic compression thereon, a subband splitting device for splitting the broadband input signal into K narrowband subband signals ($SSB_1, \ldots SSB_k, \ldots SSB_K$), where K is an integer larger than 1, an amplifier unit for amplifying each of the K subband signals by a respective amplification factor ($A_1, \ldots A_K$) to obtain K amplified subband signals, a subband combining device for combining the K amplified subband signals to obtain a broadband output signal, which is a dynamically compressed version of the broadband input signal, an envelope detecting device for generating for each of the K subbands a respective one of K envelope signals, an amplifier control device for generating in response to the K envelope signals K amplifier control signals, each of the K amplifier control signals being representative of one of the K amplification factors, said amplifier control device is adapted to generate an amplification control signal in response to more than one of the K envelope signals, wherein the amplifier control device comprises:

K inputs (111.1, . . . , 111.k, 111.K) for receiving the K envelope signals, K divider units (211.1, . . . , 211.k, 211.K), each having an first and a second input (212.k, 213.k) and an output (214.k), K lowpass filter units (215.1, . . . 215.k, . . . , 215.K), each having an input (216.k) coupled to a respective one (211.k) of the K inputs of the amplifier control device, and an output (217.k) coupled to a respective one (213.k) of the second inputs of the K divider units (211.k), a signal combination unit having K inputs, each input (218.k) being coupled to a respective one (217.k) of the outputs of the K lowpass filter units (215.k), and an output, the signal combination unit being adapted to generate a combination signal in response to the signals received via its inputs, K multiplication units (222.1, . . . , 222.k, . . . , 222.K), each having a first input (223.k) coupled to a respective one of the K inputs of the amplifier control device, a second input (224.k) coupled to the output of the signal combination unit, and an output (225.k), K outputs (112.1, . . . , 112.K) for supplying the K amplifier control signals representative of the amplification factors, each of the K outputs (112.k) being coupled to a respective one (225.k) of the outputs of the K multiplication units.

\* \* \* \* \*